US 6,571,366 B1

(12) United States Patent
Doetsch et al.

(10) Patent No.: US 6,571,366 B1
(45) Date of Patent: May 27, 2003

(54) METHOD FOR PACKET TRANSMISSION WITH AN ARQ PROTOCOL ON TRANSMISSION CHANNELS IN A DIGITAL TRANSMISSION SYSTEM

(75) Inventors: Markus Doetsch, Koblenz (DE); Jörg Plechinger, München (DE); Peter Jung, Otterberg (DE); Friedbert Berens, Kaiserslautern (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/486,335

(22) PCT Filed: Jul. 29, 1998

(86) PCT No.: PCT/DE98/02165
§ 371 (c)(1),
(2), (4) Date: Feb. 22, 2000

(87) PCT Pub. No.: WO99/11010
PCT Pub. Date: Mar. 4, 1999

(30) Foreign Application Priority Data

Aug. 22, 1997 (DE) ............................................. 197 36 676

(51) Int. Cl.[7] ...................... H03M 13/29; H03M 13/35; H03M 13/45
(52) U.S. Cl. ...................... 714/751; 714/774; 714/780; 714/790
(58) Field of Search ................................. 714/751, 774, 714/780, 790

(56) References Cited

U.S. PATENT DOCUMENTS

| | | | | |
|---|---|---|---|---|
| 5,214,675 A | * | 5/1993 | Mueller et al. | 375/340 |
| 5,278,871 A | * | 1/1994 | Rasky et al. | 375/285 |
| 5,546,429 A | * | 8/1996 | Chiasson et al. | 375/341 |
| 5,907,582 A | * | 5/1999 | Yi | 370/208 |
| 5,983,384 A | * | 11/1999 | Ross | 714/755 |
| 6,189,123 B1 | * | 2/2001 | Anders Nystrom et al. | 714/751 |
| 6,272,183 B1 | * | 8/2001 | Berens et al. | 375/262 |

FOREIGN PATENT DOCUMENTS

| | | |
|---|---|---|
| DE | 195 21 327 A1 | 12/1996 |
| WO | WO 98/05140 | 2/1998 |
| WO | WO 98/43383 | 10/1998 |

OTHER PUBLICATIONS

K.R. Narayanan et al., "A Novel ARQ Technique using the Turbo Coding Principle", IEEE Comm. Letters, vol. 1. No. 2, (1997) pp. 49–51.

(List continued on next page.)

Primary Examiner—Stephen M. Baker
(74) Attorney, Agent, or Firm—Staas & Halsey LLP

(57) ABSTRACT

In a method for packet transmission using an ARQ protocol on transmission channels in a digital transmission system, for channel coding, turbo coding is carried out in a turbo coder at the transmitter end and turbo decoding is carried out in a turbo decoder at the receiver end using soft-decision output signals. A return channel is provided, which the receiver uses to request the information from faulty packets once again. An RCPTC is used as the turbo code. When the information in a faulty packet is retransmitted, at least a portion of the information suppressed by the puncturing of the RCPTC in the previous transmission is transmitted. This additional information is inserted into the already existing information at the receiver end, and this completed information is decoded once again. When the repeat transmission is made, the only bits which are transmitted are those which are additionally available at the next lower coding rate, since they are not punctured. The method is repeated, until the packet is decoded without any errors or all of the coded information in a packet is transmitted.

10 Claims, 5 Drawing Sheets

OTHER PUBLICATIONS

M. Nasshan et al., "New Results on the Application of Antenna Diversity and Turbo–Codes in a JD–CDMA Mobile Radio System", PIMRC '94 and WCN, Den Haag, NL, vol. 2, (1994) pp. 524–528.

P. Jung, "Comparison of Turbo–Code Decoders Applied to Short Frame Transmission Systems", IEEE Journal on Selected Areas (1996) pp. 530–537.

K. R. Narayanan et al. "Physical Layer Design for Packet Data Over IS–136", IEEE $47^{th}$ Vehic. Technol. Conf. vol. 2. No. 47, (1997) pp. 1029–1033.

D. Divsala et al "Turbo–Codes for BCS Applications" ICC '95, (1995), 6 pages.

C. Berrou et al. "Near Shannon Limit Area Correction Coding: Turbo–Codes" IEEE In. Conf. on Communications, (1993) pp. 1064–1070.

C. Douillard et al, "Iterative Correction of Inter–symbol Interference: Turbo–Equalization" ETT Eur. Trans. on Telecomm., vol. 6, No. 5, (1995), pp. 507–511.

P. Jung et al., "Applying Turbo–Codes to the Uplink in a JD–CDMA Mobile Radio System Using Coherent Receiver Antenna Diversity" ITG–Fachbericht 130, (1994) pp. 49–56.

* cited by examiner

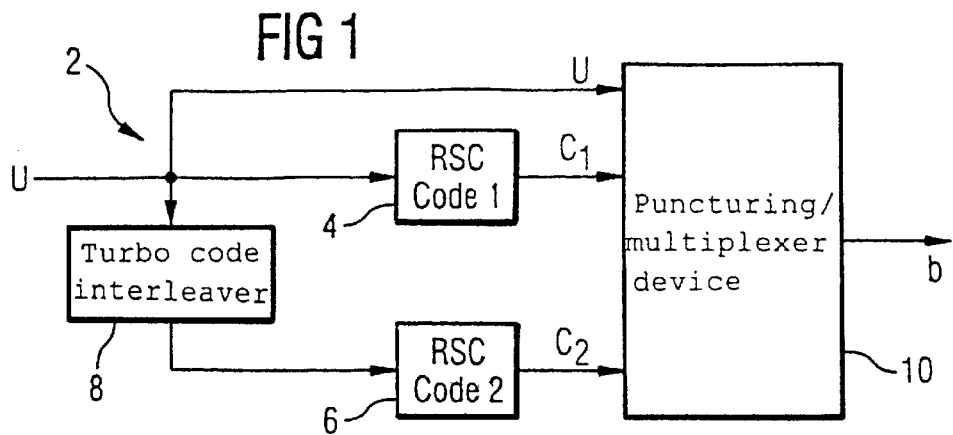
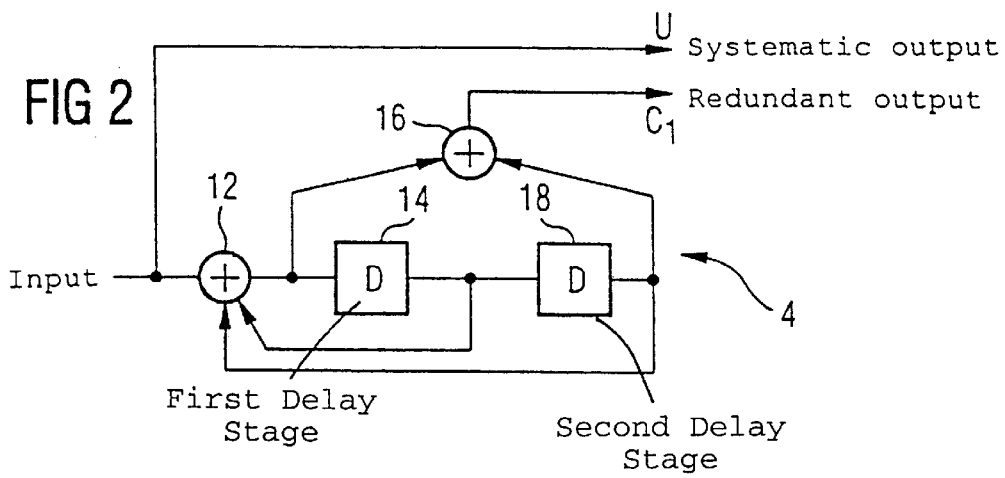
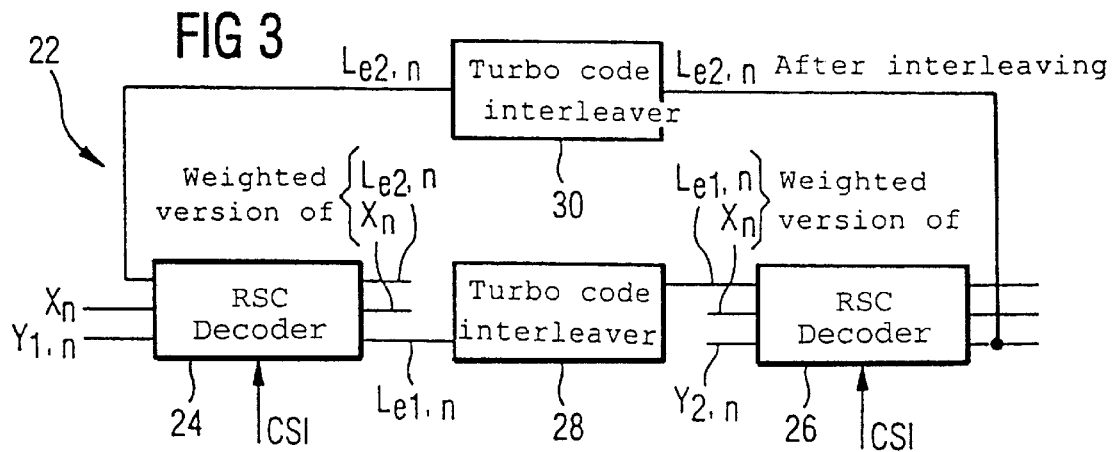

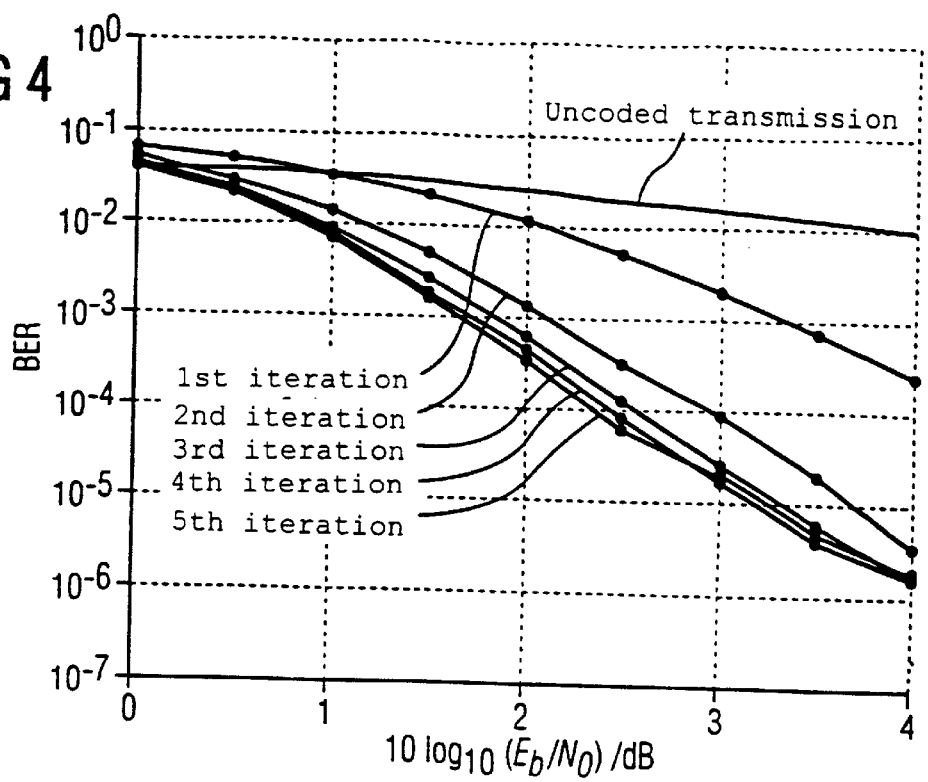
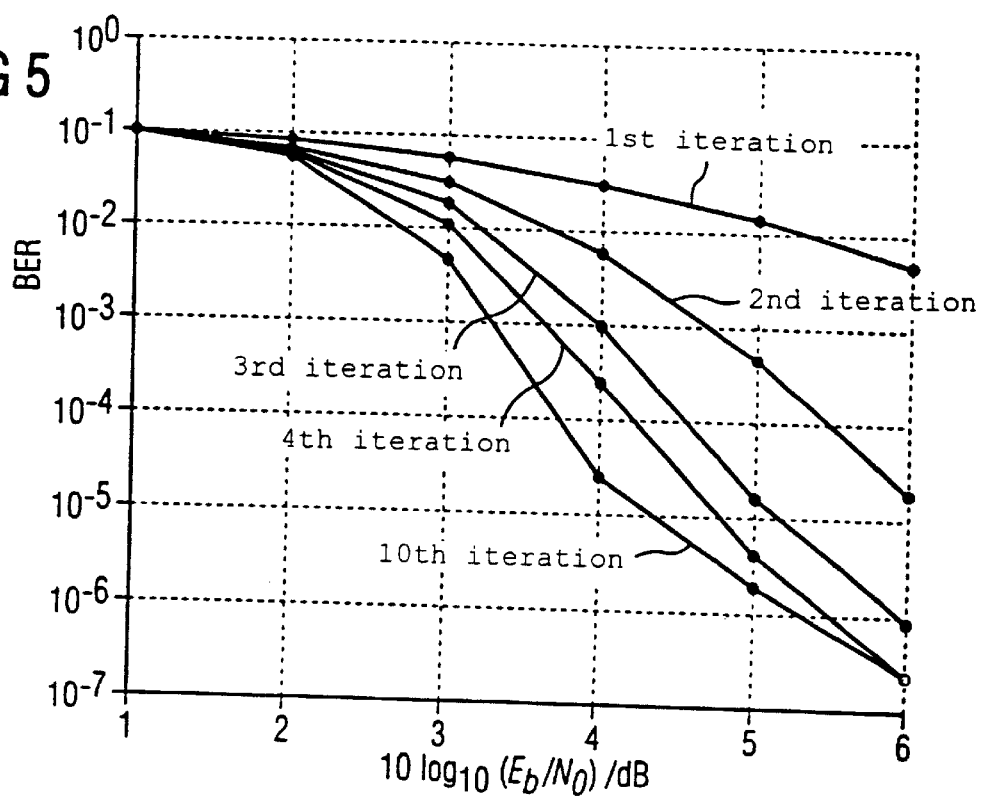

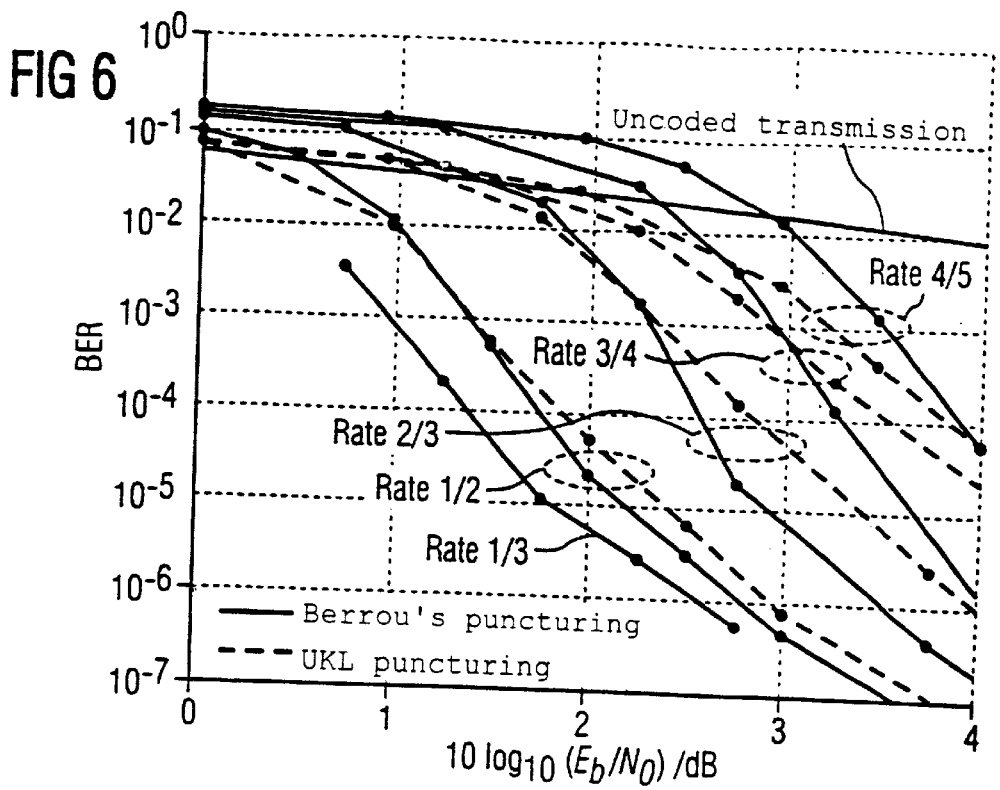
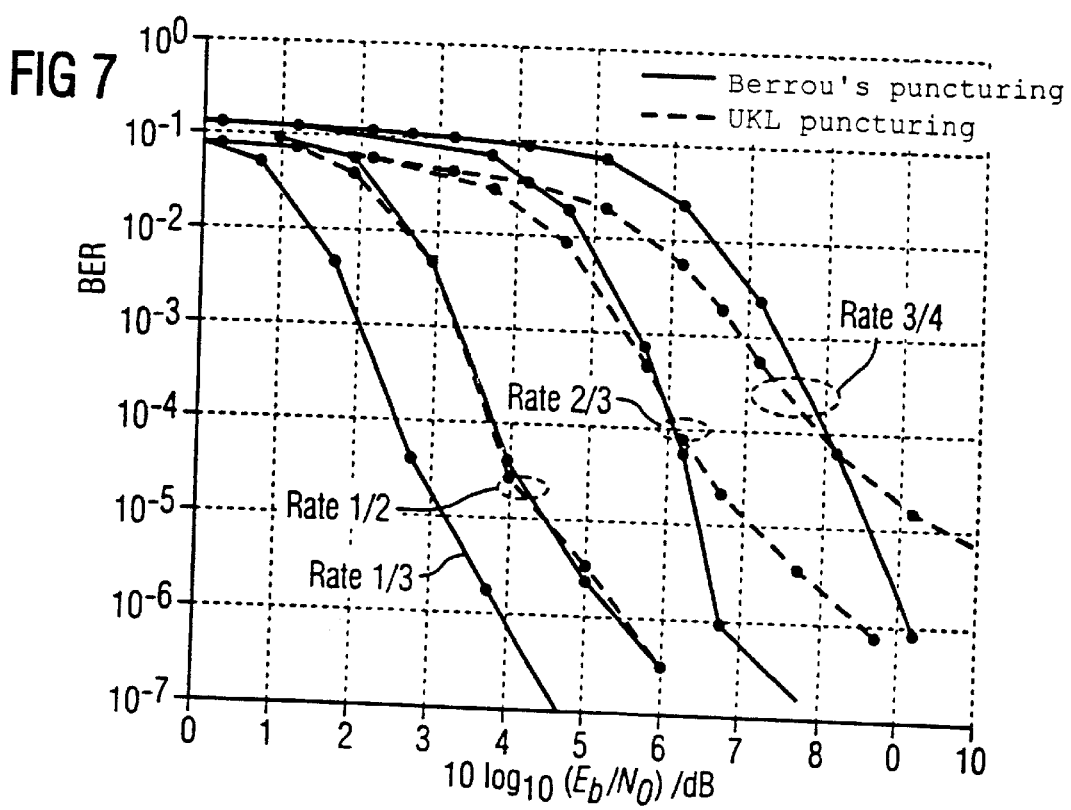

METHOD FOR PACKET TRANSMISSION WITH AN ARQ PROTOCOL ON TRANSMISSION CHANNELS IN A DIGITAL TRANSMISSION SYSTEM

BACKGROUND OF THE INVENTION

1. Field of the Invention

The invention relates to a method for packet transmission using an ARQ protocol on transmission channels in a digital transmission system, in which, for channel coding, turbo coding is carried out. This turbo coding is carried out a turbo coder at the transmitter end and turbo decoding is carried out in a turbo decoder at the receiver end using soft-decision output signals, with a return channel, being provided, by the way of which the receiver re-quests the information from faulty packets.

2. Description of the Related Art

The use of turbo codes for digital transmission systems is investigated in P. Jung "Comparison of Turbo-Code Decoders Applied to Short Frame Transmission Systems", IEEE Journal on Selected Areas in Communications, Volume 14 (1996) pages 530–537, with both coders and decoders being investigated for the turbo codes in the transmission path. Decoding of the turbo codes is based on the use of soft-input/soft-output decoders, which can be produced using either MAP (Maximum a-posteriori) symbol estimators or MAP sequence estimators, for example, an estimator using an a-priori soft-output Viterbi algorithm (APRI-SOVA). This publication describes four different decoder arrangements and their capabilities to process specific error rates. Furthermore, the performance of these decoders is investigated for different applications. It has been found that the turbo codes and their iterative decoding are an effective measure against packet errors.

ICC '95, Seattle, Wash., Jun. 18–22, 1995, "Turbo Codes for BCS Applications", D. Divsalar and F. Pollara, proposes turbo codes to achieve error correction virtually as far as the Shannon limit. The use of relatively simple component codes and large interleavers are considered for this purpose. In this publication, the turbo codes are produced in a coder using multiple codes, and are decoded in a suitable decoder. The turbo codes were introduced by Berrou et al. 1993 (see C. Berrou, A. Glavieux and P. Thitimayshima, "Near Shannon limit area correction coding: Turbo codes" Proc. 1993 IEE International conference on communications, pages 1064–1070). On the one hand, this method allows very good error correction to be achieved.

Turbo equalization is known from ETT European Transactions on Telecommunications, Vol. 6, No. 5, September–October 1995, "Iterative Correction of Intersymbol Interference: Turbo-Equalization", Catherine Douillard et al., whose use is intended to overcome the disadvantageous effects of intersymbol interference in digital transmission systems which are protected by convolution codes. The receiver makes two successive soft-output decisions, which are made in an iterative process by a symbol detector and a channel decoder. Each iteration makes use of extrinsic information from the detector and the decoder for the next iteration, as with turbo decoding. Douillard, et al. found that intersymbol interference effects in multipath channels can be overcome by turbo equalization.

The publication "A Novel ARQ Technique using the Turbo Coding Principle", Narayanan et al., IEEE Communications Letters, Volume 1, No. 2, March 1997, pages 49–51 describes an ARQ-III method using punctured turbo codes, in which the bits which were punctured for the first transmission are transmitted after the occurrence of faulty data packets. The receiver then combines the punctured code and the punctured bits, and thus obtains the unpunctured code.

Future transmission systems, for example the European UMTS (Universal Mobile Telecommunications System), require the support of a large number of co-existing carrier services with carrier data rates of up to 2 Mbit/s in a flexible manner, with the best-possible spectral efficiency being desirable. An MA (Multiple Access) scheme has been developed in the ACTS (Advanced Communications Technologies and Services) project AC090 FRAMES (Future Radio Wideband Multiple Access Systems), which is called FRAMES Multiple Access (FMA) and satisfies the UMTS requirements. As a third-generation transmission system, which covers a wide range of application areas, carrier services and widely differing scenarios, FMA must to comply with present and future developments of UMTS radio interface standards. FMA comprises two operating modes, namely WB-TDMA (Wideband Time Division Multiple Access) with and without spreading and compatibility with GSM (Global System for Mobile Communications) and WB-CDMA (Wideband Code Division Multiple Access). Although, essentially, a system based on FMA is considered here, it is also possible to include other transmission systems using multiple access methods, for example FDMA (Frequency Division Multiple Access) MC-CDMA (Multicarrier-CDMA) or combinations of the said transmission systems.

With regard to the high performance of turbo codes, it is desirable to use these codes in digital transmission systems. The complex requirements, for example for FMA, mean, however, that it is necessary when using such turbo codes to ensure that the data transmission makes full use of the capabilities of the turbo codes.

SUMMARY OF THE INVENTION

The invention is based on the object of providing a method for packet transmission using an ARQ protocol on transmission channels in a digital transmission system in which turbo coding is used for channel coding, in which the channel loading from ARQ can be kept as low as possible by way of a new turbo code and puncturing matched to it.

The present invention implements a method for packet transmission using an ARQ (Automatic Repeat ReQuest) protocol on transmission channels in a digital transmission system, comprising the steps of turbo coding, for channel coding, in a turbo coder at a transmitter end, utilizing a punctured turbo code with a variable coding rate, wherein said coding rate is chosen as a function of a Quality of Service of a transmission channel which is one of the transmission channels, turbo decoding in a turbo decoder at a receiver end, requesting coded packets incorrectly sent, by the receiver via a return channel, transmitting a portion of information suppressed by a puncturing of turbo code in a previous transmission, constituting additionally transmitted information, when an incorrectly coded packet is re-transmitted, inserting said additionally transmitted information into already existing information at said receiver end, and decoding resultant completed information again.

When the RCPTC is used, the coding rate can be set by suitable puncturing of the systematic or non-systematic information at the output of the turbo encoder. An increase in the coding rate, i.e., more information being punctured, in this case means that the decoding result is worse for a given channel quality. This means that the bit error rate BER increases. The use of the RCPTC for channel coding means that it is not necessary to transmit the entire packet once again in packet-switching services when an ARQ is initiated. The first transmission of the packet is carried out using a high coding rate, with little error protection. If the packet is identified as being faulty, then an ARQ is initiated. After this, rather than transmitting the entire packet again, only the information which was punctured in the first transmission, or a portion of this punctured information, is transmitted. The coding rate is thus compatibly matched to the channel as a result of which, overall, less data need be transmitted over the channel. The advantage of this method is thus that the total load on the channel is reduced.

In this document, the term Quality of Service is used as follows. Specific QoS criteria (QoS=Quality of Service) apply to various services, and the definitions of the QoS criteria for various carrier services have been worked out in the course of FRAMES. One important component of a QoS criterion is the carrier data rate R. The QoS criterion also includes a maximum permissible error rate $P_b^G$ or a packet loss rate $P_l^G$ in conjunction with a maximum failure probability $P_{out}^G$. In the case of line-switched services, the probability $Pr\{P_b > P_b^G\}$ of the instantaneous bit error rate $P_b$ exceeding $P_b^G$ must not be greater than $P_{out}^G$, i.e., $$Pr\{P_b > P_b^G\} < P_{out}^G.$$

For voice transmission, $P_b^G$ is equal to $10^{-3}$ and $P_{out}^G$ is equal to 0.05. A similar condition for the instantaneous packet loss rate $P_l$ applies to packet services:

$$Pr\{P_l > P_l^G\} < P_{out}^G.$$

Apart from the criteria relating to Pr, there are also other conditions relating to the QoS criterion. However, the QoS parameters $P_b^G$, $P_l^G$ and $P_{out}^G$ will mainly be considered here, which relate directly to the choice of the error correction code (ECC). For ECC, the coding rate $R_c$ is essentially governed by the multiple access method, the modulation and the packet parameters. In other words, the coding rate $R_c$ is directly related to the question as to whether a QoS criterion is or is not satisfied for a specific service.

In a method in which a soft-input/soft-output symbol or sequence estimator is used at the receiver end, it is advantageous for the Quality of Service to be determined from the variances $\sigma^2$ of the soft-decision output signals from the turbo decoder; the bit error rate is advantageously calculated from the variances $\sigma^2$ as a measure of the Quality of Service.

In a method in which an MAP symbol estimator or an MAP sequence estimator is used at the receiver end, it is advantageous for the Quality of Service to be determined from the variances $\sigma^2_{LLR}$ of the soft-decision output signals from the turbo decoder.

In a method in which a Viterbi algorithm for sequence estimation is used at the receiver end, it is advantageous for the Quality of Service to be determined from the variances $\sigma^2_{VIT}$ of the soft-decision output signals from the turbo decoder.

Since the method according to the invention can be used not only with MAP estimators but also for estimation using a Viterbi algorithm, there is virtually no limitation with regard to the most important methods for sequence and symbol estimation. This is true even though this statement is used only in conjunction with an MAP symbol estimator in the following specific description.

According to one advantageous refinement, the method according to the invention is characterized in that Berrou's puncturing is used for puncturing, in which only the non-systematic information is punctured. This type of puncturing is advantageous for relatively low signal-to-noise ratio values.

According to one advantageous refinement, the method according to the invention is characterized in that UKL puncturing is used for puncturing, in which both systematic information and non-systematic information are punctured. This type of puncturing is advantageous for relatively high signal-to-noise ratios, and thus for bit error rates of $<10^{-4}$.

According to one advantageous refinement, the method according to the invention is characterized in that when the repeat transmission is made, the only bits which are transmitted are those which are additionally available at the next lower coding rate, since they are not punctured. In consequence, only the minimum required information is transmitted in order to achieve the aim of reasonable transmission quality.

According to one advantageous refinement, the method according to the invention is characterized in that the method is repeated until the packet is decoded without any errors or all of the coded information in a packet is transmitted. The entire potential of the coding is thus always fully utilized to correct the errors in a packet.

BRIEF DESCRIPTION OF THE DRAWINGS

Exemplary embodiments of the invention are described below with reference to the attached drawings; in which:

FIG. 1 is a block diagram showing a turbo coder;

FIG. 2 is a block diagram showing an RSC coder, as is used in a turbo coder as shown in FIG. 1;

FIG. 3 is a block diagram of a turbo decoder;

FIG. 4 is a graph of the performance of an RCPTC in an AWGN channel as a function of the number of iterations of turbo decoding;

FIG. 5 is a graph of the performance of an RCPTC in a Rayleigh channel for a different number of iterations of turbo decoding;

FIG. 6 is a graph of the performance of an RCPTC in an AWGN channel as a function of different coding rates;

FIG. 7 is a graph of the performance of an RCPTC in a Rayleigh channel as a function of different coding rates;

DESCRIPTION OF THE PREFERRED EMBODIMENTS

Figure 8:
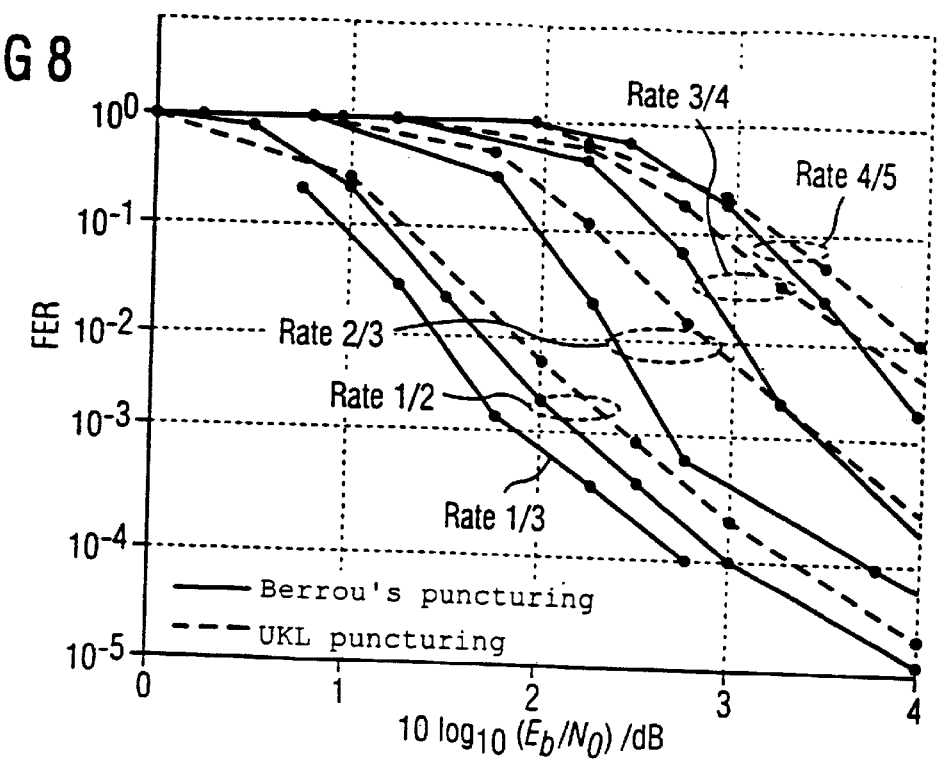
FIG. 8 is a graph of the performance of an RCPTC in an AWGN channel for various coding rates.

With regard to economic use of the hardware, the ECC circuit should be usable as universally as possible, while at the same time the ECC configuration should allow high flexibility by way of software control. The RCPTC used here allows this, since it has the necessary flexibility. The RCPTC can be produced using the turbo coder 2 shown in FIG. 1. The turbo coder 2 has $N_e=2$ binary, recursive, systematic convolution coders 4, 6 (RSC) with a small constraint length, for example between 3 and 5, which are connected in parallel using a turbo interleaver 8. The input sequence u is supplied to the coder 4 (RSC, Code 1) and, via the turbo code interleaver 8, to the coder 6 (RSC, Code 2) as well as to a puncturing/multiplexer device 10. The puncturing/multiplexer device receives a further input C1 from the coder 4 and a further input C2 from the coder 6. The output of the puncturing/multiplexer device 10 is the output sequence b.

In the turbo coder 2, the minimum code rate $R_c$ min is equal to $1/(N_{e+1})=1/3$. The minimum coding rate $R_{c,min}$ could be further reduced by using additional RSC coders.

The binary input sequence u, which has a finite time duration, is entered in the coder 4, at whose output it produces the redundant sequence $C_1$ with the same finite duration as u. The sequence $u_I$, which represents the sequence u after interleaving, is passed to the coder 6. The coding in the coder 6 results in the redundant sequence $C_2$. The redundant sequences $C_1$ and $C_2$ and the sequence u are punctured and multiplexed, in order to form the output sequence b. The turbo coder is a systematic coder, with u being the basis of the systematic information contained in b.

An RSC coder, as can be used for the coders 4 and 6, is shown in FIG. 2, using the example of the coder 4. The sequence u is applied as systematic information to one input of the coder 4. The sequence u passes via an addition element 12 to a delay stage 14 and to a further addition element 16. The output signals from the first delay stage 14 pass to a second delay stage 18 and to the addition element 12. The output signals from the second delay stage 18 pass to the addition stage 12 and to the addition stage 16. The output from the addition stage is then the redundant sequence $C_1$.

The hardware costs are a significant factor in the choice of this coder, and should be kept as low as possible. For this reason, the two RSC coders for use in the context of FRAMES are identical and have a constraint length of 3. Although these RSC coders have only four states, their performance is good when the values of the signal-to-noise ratio $E_b/N_0$ are low. The performance of the RCPTC using these coders is thus advantageous at low signal-to-noise ratios.

The output sequence b of the turbo coder 2 passes via the transmission channel and a demodulator to the turbo decoder 22 (FIG. 3), which has an RSC decoder 24 and a second RSC decoder 26. A turbo code interleaver 28 is provided between one output of the decoder 24 and one input of the decoder 26. A turbo code interleaver 30 is provided between one output of the decoder 26 and one input of the decoder 24. The decoders 24, 26 are soft-input/soft-output decoders.

The demodulator (not shown) supplies estimated values $x_n$ of the systematic information $u_n$ which is contained in u, as well as estimated values $y_{1,n}$ and $Y_{2,n}$ of the transmitted redundant bits, which have been produced by the coders 4 and 6, respectively. The two decoders 24, 26 require channel state information (CSI), which comprises the instantaneous signal amplitudes and the noise variance. Each of the decoders 24, 26 processes the systematic information, the redundant and a-priori information $L_{e1,n}$ and $L_{e2,n}$ while processing the CSI, as a result of which the extrinsic information $L_{e2,n}$ and $L_{e1,n}$ is produced, which is then used as a-priori knowledge in the downstream decoder. The decoding process is iterative, and the result of the decoding process is improved with each iteration. However, the amount of improvement gradually decreases with further iterations. After a certain number of iterations, the output signal from the turbo decoder 22 is supplied to a detector (not shown), as is normal for such transmission systems.

In order to match the use of the RCPTC to the existing service requirements, it would be conceivable to adapt the RSC coders, but this would lead to undesirable increased hardware costs. The matching of the interleaver size to the specific services is known, and is also a problem when using an RCPTC due to its flexibility.

Furthermore, the number of iterations for decoding can be set in accordance with the QoS criterion, taking into account the overall coding complexity. There are two options at the receiver for utilizing this characteristic of the turbo code. For a given QoS criterion, the number of iterations can be increased as the signal-to-noise ratio $E_b/N_0$ rises. This is particularly advantageous in fading channels, for example, in transmission channels. Alternatively, the number of iterations can also be varied with a QoS criterion that changes with time. The capability to adjust the number of decoding iterations is available only when using turbo codes, particularly an RCPTC.

A further option for improving the performance in a system with an RCPTC is to set the puncturing so that an RCPTC with varying code rates $R_{c,min}<=R_c<=R_{c,max}$ can be provided, via which the coding characteristics can be changed without changing the turbo code interleavers or RSC coders.

In principle, the sequences u, $C_1$ and $C_2$ are available for puncturing. If two of the sequences are completely suppressed by puncturing, the maximum code rate $R_{c,max}=1$ is assumed. In this case, the coding characteristics depend on which of the sequences are punctured. If, for example, the redundant sequences $C_1$ and $C_2$ are completely punctured, with only the sequence u being passed through unchanged, no ECC is available and time diversity gain cannot be achieved in receivers for fading channels. In this situation, the turbo decoder is reduced to a simple threshold-value detector.

If one of the redundant sequences $C_1$ or $C_2$ is completely suppressed by the puncturing process, in which case only the second redundant sequence together with the sequence u can pass through, the turbo coder becomes a conventional RSC coder. The turbo decoder is reduced to an RSC decoder, which is designed to carry out half an iteration. In this case, there is no a-priori knowledge based on extrinsic information. The coding rate $R_c$ may be varied between 1/2 and 1, depending on the QoS criterion. Since $N_e=2$, the RSC coders can be based on two different codes, and the QoS criterion and the coding complexity can be varied by suppressing a specific redundant sequence $C_1$ or $C_2$, without changing the coding rate $R_c$.

However, the options mentioned above prevent turbo code operation, which is available only when bits of the two redundant sequences $C_1$ and $C_2$ are transmitted and $$u_n \ne u_{1,n}$$

where $u_n$ and $u_{1,n}$ are contained in u and $u_1$, respectively. In this case, $$R_{c,min}<=R_c<1.$$

The minimum coding rate $R_{c,min}=1/(N_e+1)$ is achieved if no puncturing is carried out. Here, either the conventional RSC decoding or turbo decoding may be provided, depending on the QoS criterion and transmission channel state, with both factors varying with time for transmission applications.

The following versions are possible for real turbo code operation. The sequence u is not punctured, the redundant sequences $C_1$ and $C_2$ are partially punctured. In this case, operation as RSC code or as turbo code is possible, the number of decoding iterations can be adjusted, and the coding rate may be between 1/3 and 1. This type of puncturing is called Berrou's puncturing.

An alternative option is for the sequence u and the redundant sequences $C_1$ and $C_2$ to be partially punctured. In this case, operation with RSC code is impossible, and is possible only with turbo code. The number of decoding iterations can be adjusted, and the coding rate may be between 1/3 and 1. This type of puncturing is called UKL (University Kaiserslatern) puncturings. Finally, when operation with an RSC code and a turbo code is possible. The number of decoding iterations can be adjusted, and the coding rate is around 1/3.

The advantageous feature of RCPTC is the capability to vary the coding rate $R_c$ adaptively, in which case the required information for an ARQ can be transmitted without having to transmit the entire, coded packet. It is sufficient to transmit an additional part of the information, which compensates for the difference in the coding rate.

Now that the options for adaptation of the coding in the case of RCPTC have been described, the effects of the matching options on the performance of the system using RCPTC will be described, on the basis of simulations.

FIG. 4 shows the performance of the RCPTC as a graph showing the bit error rate BER plotted against the signal-to-noise ratio $E_b/N_0$ for voice transmission via an AWGN channel. The packet size was 150 bits, and the coding rate was roughly 1/3. The carrier data rate for voice transmission was 8 kbit/s. The uncoded transmission is shown as a reference line. The parameter for these simulations is the number of decoding iterations, which varies between 1 and 5. After the first decoding iteration, the minimum signal-to-noise ratio which is required to achieve a bit error rate of $<10^{-3}$ is approximately equal to 3.5 dB. After the second decoding iteration, approximately 1.3 dB less is required. The next decoding iteration allows a further gain of 0.2 dB. The next iteration allow gains of less than 0.1 dB. After five iterations, the minimum signal-to-noise ratio which is required for a bit error rate of less than $10^{-3}$ is approximately equal to 1.8 dB. It can thus be seen that the performance improvement becomes less as the number of iterations increases. By comparison, a conventional NSC code with a constraint length of 9 requires approximately 1.9 dB to achieve the same bit error rate of $<10^{-3}$. The RCPTC is thus somewhat more powerful than conventional codes, even with packet sizes as small as 150 bits.

FIG. 5 shows a graph of the performance of the RCPTC, in which the bit error rates BER are plotted against the signal-to-noise ratio $E_B/N_0$ for narrowband ISDN with a carrier data rate of 144 kbit/s, a packet size of 672 bits, a code rate of about 1/2 and a Rayleigh fading channel which is completely subjected to interleaving. The simulation parameter is once again the number of decoding iterations. After four decoding iterations, a bit error rate of less than $10^{-3}$ requires a minimum signal-to-noise ratio of 3.8 dB. Only about 3.4 dB is still required after ten iterations. A conventional NSC code with a decoding complexity similar to that of four decoding iterations has a constraint length of 8, and requires a signal-to-noise ratio that is 1.1 dB greater.

Figure 9:
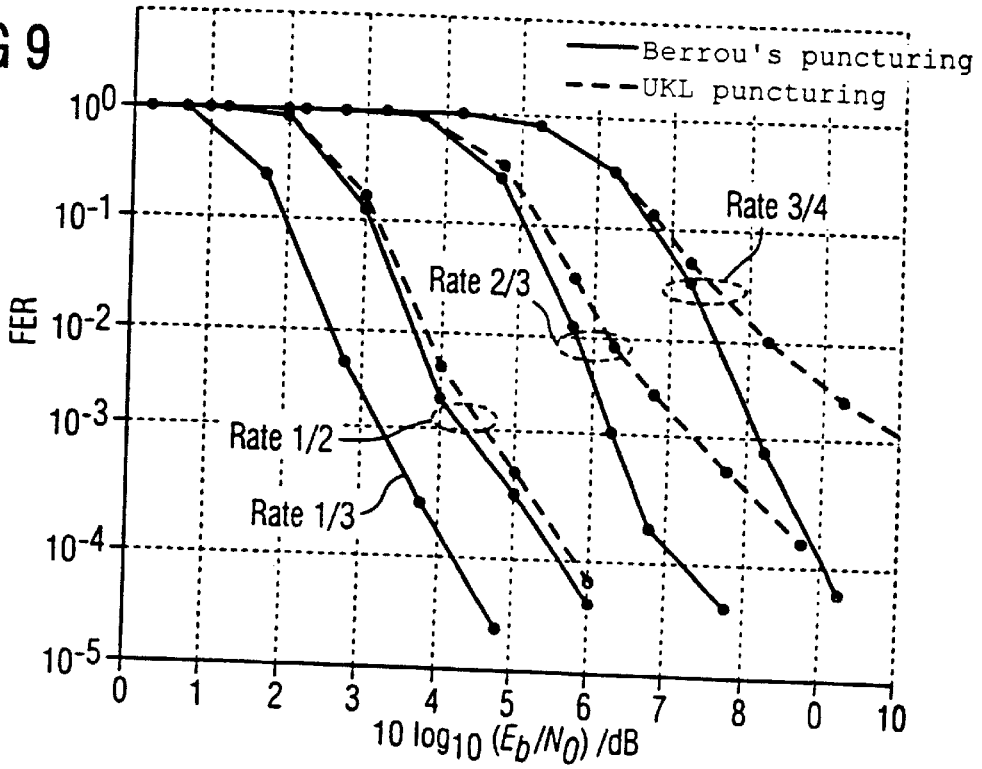
FIG. 9 is a graph of the performance of an RCPTC in a Rayleigh channel for various coding rates.

FIGS. 6 to 9 show graphs of the performance when using the RCPTC, with the bit error rate BER or the frame error rate FER, respectively, being plotted against the signal-to-noise ratio $E_B/N_0$. FIG. 6 shows the bit error rate plotted against the signal-to-noise ratio for a packet size of 672 bits, ten decoding iterations and one AWGN channel. FIG. 7 shows the bit error rate plotted against the signal-to-noise ratio for a packet size of 672 bits, ten decoding iterations and a Rayleigh fading channel which is completely subjected to interleaving. FIG. 8 shows the frame error rate FER plotted against the signal-to-noise ratio for a packet size of 672 bits, ten decoding iterations and one AWGN channel. FIG. 9 shows the frame error rate plotted against the signal-to-noise ratio for a packet size of 672 bits, 10 decoding iterations and a Rayleigh fading channel which is completely subjected to interleaving. The graphs in FIGS. 6 to 9 use two different puncturing methods, namely Berrou's puncturing and UKL puncturing, which have been mentioned above. As can be seen, Berrou's puncturing has better performance for lower values of the signal-to-noise ratio, while UKL puncturing is advantageous for a high signal-to-noise ratio, and thus for bit error rates of $<10^{-4}$. The intersections move in the direction of lower bit error rates as the coding rates increase.

Figure 10:
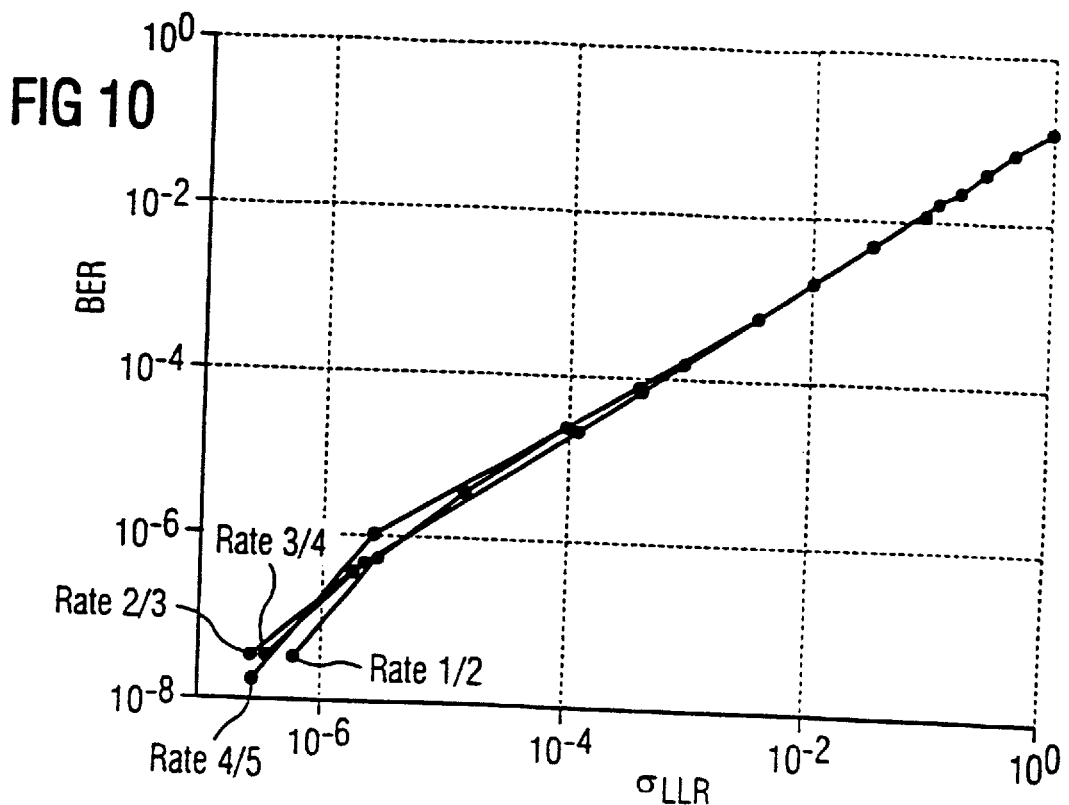
FIG. 10 is a graph of the relationship between the bit error rate BER and the variance $\sigma^2_{LLR}$ of the output of the second decoder.

In FIG. 10, the bit error rate is plotted against the variance of the log-likelihood ratios (LLR) at the output of the second decoder, with an RCPTC, a packet size of 372 bits, ten decoding iterations and one AWGN channel being assumed. It can be seen from this figure that the coding rate has no effect on the relationship between the bit error rate and the variance $\sigma^2_{LLR}$, since these two variables are similarly dependent on the signal-to-noise ratio $E_B/N_0$. Thus, if $\sigma^2_{LLR}$ is known, the bit error rate can easily be estimated, and this result can be used as a basis for an action, for example, adaptation of the number of decoding iterations or adaptation of the coding rate in order to improve the transmission quality or, in the case of ARQ, to request a repeat transmission of an incorrectly coded packet.

Figure 11:
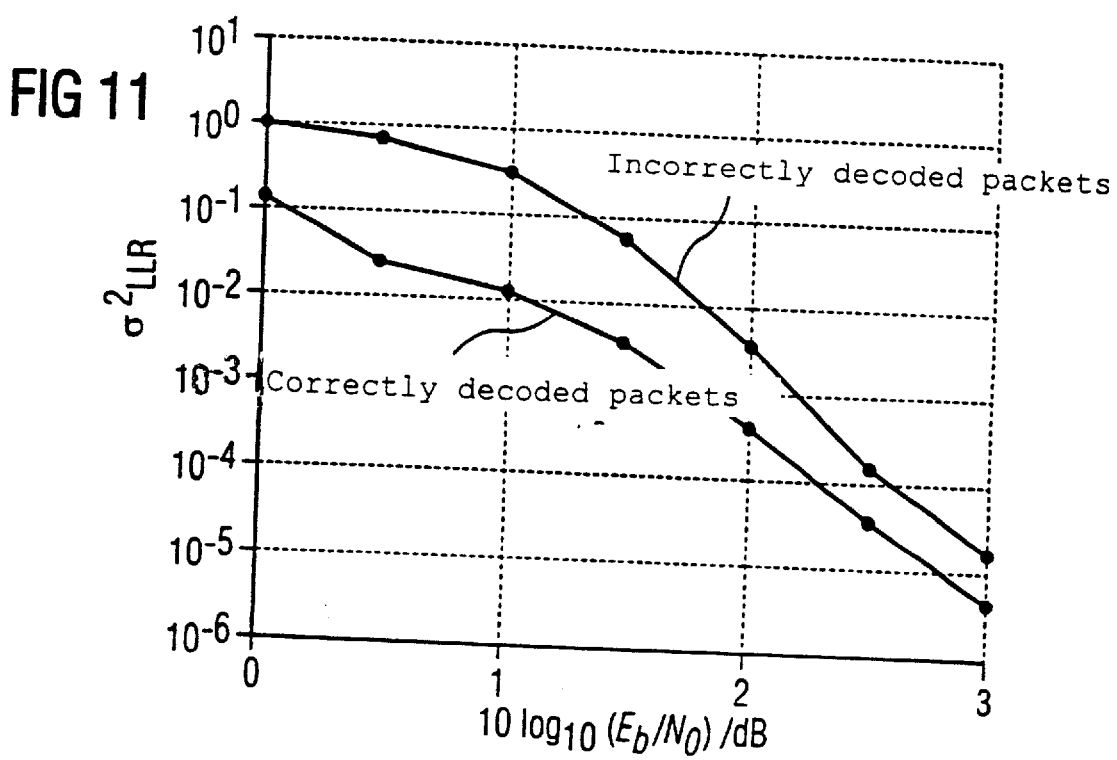
FIG. 11 is a graph of the variance $\sigma^2_{LLR}$ plotted against the signal-to-noise ratio for incorrectly and correctly decoded packets.

Finally, FIG. 11 shows the variance $\sigma^2_{LLR}$ of the log-likelihood ratio LLR of the output of the second decoder plotted against the signal-to-noise ratio $E_B/N_0$ when using an RCPTC with a packet size of 600 bits, a code rate of about 5/9, ten decoding iterations and one AWGN channel. The RCPTC was designed for a 64 kbit/s carrier service. From FIG. 11, it can be seen that a similar consideration to that in connection with FIG. 10 also applies to the dependency of the variance $\sigma^2_{LLR}$ on the occurrence of packet errors. $\sigma^2_{LLR}$ for incorrectly decoded packets is always greater than $\sigma^2_{LLR}$ for correctly decoded packets. Thus, if the signal-to-noise ratio $E_B/N_0$ and $\sigma^2_{LLR}$ are known for a packet which is currently being checked, a soft-decision variable, which is related to the probability of a packet error, can easily be produced and used for control purposes.

Although the present description relates mainly to use of the invention with digital mobile telephones, the invention is not limited to this but can in general be used for digital transmission systems, for example, power-based systems, optical transmission systems (infrared and laser transmission systems), satellite radio systems, deep-space transmission systems, radio-link transmission systems and broadcast-radio transmission systems (digital radio or TV), with the above advantages.

What is claimed is:

1. A method for packet transmission using an ARQ (Automatic Repeat ReQuest) protocol on transmission channels in a digital transmission system, comprising the steps of:

turbo coding, for channel coding, in a turbo coder at a transmitter end, utilizing a punctured turbo code with a variable coding rate, wherein the coding rate is chosen as a function of a quality of service of a transmission channel which is one of the transmission channels;

turbo decoding in a turbo decoder at a receiver end;

requesting coded packets incorrectly sent, by the receiver via a return channel;

transmitting a portion of information suppressed by a puncturing of turbo code in a previous transmission, constituting additionally transmitted information, when an incorrectly coded packet is retransmitted;

inserting the additionally transmitted information into already existing information at the receiver end;

decoding resultant completed information again; and producing a soft-decision output signal using a soft-input/soft-output symbol or sequence estimator at the receiver end so that the quality of service is determined from variances of the soft-decision output signals from the turbo decoder.

2. The method as claimed in claim 1, wherein Berrou's puncturing is used for said puncturing, and wherein only non-systematic information is punctured.

3. The method as claimed in claim 1, wherein UKL puncturing is used for said puncturing, and wherein both systematic information and non-systematic information are punctured.

4. The method as claimed in claim 1, further comprising the step of initiating a repeat transmission of incorrectly coded packets as a function of said Quality of Service of said transmission channel.

5. The method as claimed in claim 4, further comprising the steps of:

determining said Quality of Service of said transmission channel;

comparing said Quality of Service of said transmission channel with a nominal value; and initiating a repeat transmission of incorrectly coded packets if a nominal value is not achieved.

6. The method as claimed in claim 5, further comprising calculating a bit error rate from the variances as a measure of the quality of service of the transmission channel.

7. The method as claimed in claim 5, further comprising the step of choosing a number of data packets retransmitted as a function of said Quality of Service of said transmission channel.

8. The method as claimed in claim 7, wherein the number of data packets retransmitted is chosen based upon the quality of service of the transmission channel reaching the nominal value after the retransmission.

9. A method for packet transmission using an automatic repeat request protocol on transmission channels in a digital transmission system, comprising:

turbo coding, for channel coding, in a turbo coder at a transmitter end, utilizing a punctured turbo code with a variable coding rate, wherein the coding rate is chosen as a function of a quality of service of a transmission channel which is one of the transmission channels;

turbo decoding in a turbo decoder at a receiver end;

requesting coded packets incorrectly sent, by the receiver via a return channel;

transmitting a portion of information suppressed by a puncturing of turbo code in a previous transmission, constituting additionally transmitted information, when an incorrectly coded packet is retransmitted;

inserting the additionally transmitted information into already existing information at the receiver end;

decoding resultant completed information again;

initiating a repeat transmission of incorrectly coded packets as a function of the quality of service of the transmission channel;

determining the quality of service of the transmission channel;

comparing the quality of service of the transmission channel with a nominal value;

initiating a repeat transmission of incorrectly coded packets if a nominal value is not achieved; and producing a soft-decision output signal using an MAP symbol or sequence estimator at the receiver end, so that the quality of service is determined from the variances of the soft-decision output signals from the turbo decoder.

10. A method for packet transmission using an automatic repeat request protocol on transmission channels in a digital transmission system, comprising:

turbo coding, for channel coding, in a turbo coder at a transmitter end, utilizing a punctured turbo code with a variable coding rate, wherein the coding rate is chosen as a function of a quality of service of a transmission channel which is one of the transmission channels;

turbo decoding in a turbo decoder at a receiver end;

requesting coded packets incorrectly sent, by the receiver via a return channel;

transmitting a portion of information suppressed by a puncturing of turbo code in a previous transmission, constituting additionally transmitted information, when an incorrectly coded packet is retransmitted;

inserting the additionally transmitted information into already existing information at the receiver end;

decoding resultant completed information again;

initiating a repeat transmission of incorrectly coded packets as a function of the quality of service of the transmission channel;

determining the quality of service of the transmission channel;

comparing the quality of service of the transmission channel with a nominal value;

initiating a repeat transmission of incorrectly coded packets if a nominal value is not achieved; and utilizing a Viterbi algorithm for sequence estimation at the receiver end, so that the quality of service is determined from the variances of a soft-decision output signal from the turbo decoder.

* * * * *